US008440066B2

United States Patent
Yanada et al.

(10) Patent No.: US 8,440,066 B2
(45) Date of Patent: May 14, 2013

(54) TIN ELECTROPLATING BATH, TIN PLATING FILM, TIN ELECTROPLATING METHOD, AND ELECTRONIC DEVICE COMPONENT

(75) Inventors: Isamu Yanada, Hirakata (JP);
Masanobu Tsujimoto, Hirakata (JP)

(73) Assignee: C. Uyemura & Co., Ltd., Osaka-Shi (JP)

( * ) Notice: Subject to any disclaimer, the term of this patent is extended or adjusted under 35 U.S.C. 154(b) by 760 days.

(21) Appl. No.: 12/282,483

(22) PCT Filed: Apr. 6, 2007

(86) PCT No.: PCT/JP2007/057732
§ 371 (c)(1),
(2), (4) Date: Sep. 10, 2008

(87) PCT Pub. No.: WO2007/119691
PCT Pub. Date: Oct. 25, 2007

(65) Prior Publication Data
US 2009/0098398 A1 Apr. 16, 2009

(30) Foreign Application Priority Data
Apr. 14, 2006 (JP) .................................. 2006-111702

(51) Int. Cl.
*C25D 3/60* (2006.01)
*C25D 3/30* (2006.01)
*C25D 3/32* (2006.01)
*C23C 16/40* (2006.01)

(52) U.S. Cl.
USPC ........... 205/300; 205/252; 205/253; 205/302; 205/303; 106/1.25

(58) Field of Classification Search .................. 205/252, 205/253, 300, 302, 303; 106/1.25
See application file for complete search history.

(56) References Cited

U.S. PATENT DOCUMENTS

| 2,499,807 | A | * | 3/1950 | Yntema et al. ................ 205/238 |
| 3,483,100 | A | * | 12/1969 | Baeyens et al. ............... 205/304 |
| 3,524,824 | A | * | 8/1970 | Eden ............................. 502/211 |
| 4,388,158 | A | * | 6/1983 | Inui et al. ...................... 205/154 |
| 5,378,347 | A | * | 1/1995 | Thomson et al. ............. 205/254 |
| 2004/0253804 | A1 | * | 12/2004 | Beica et al. ................... 438/614 |
| 2006/0113006 | A1 | | 6/2006 | Masuda et al. |

FOREIGN PATENT DOCUMENTS

| CN | 1742118 A | | 3/2006 |
| JP | 55-073887 A | | 6/1980 |
| JP | 05044074 A | * | 2/1993 |
| JP | 7-048692 A | | 2/1995 |
| JP | 2000-109981 A | | 4/2000 |
| JP | 2003-293185 A | | 10/2003 |
| JP | 2003293185 A | * | 10/2003 |
| JP | 2005-2368 A | | 1/2005 |
| WO | WO 2004/065663 A1 | | 8/2004 |

OTHER PUBLICATIONS

Hasagawa et al., "The Growth of Tin Whiskers, and Methods for its Suppression", Mitsubishi Electric Corporation Technical Report, vol. 53, No. 11, pp. 781-785 (1979).
Office Action dated Aug. 11, 2010 in Chinese Application No. 200780013466.3.

* cited by examiner

*Primary Examiner* — Edna Wong
(74) *Attorney, Agent, or Firm* — Birch, Stewart, Kolasch & Birch, LLP

(57) ABSTRACT

Disclosed is a tin electroplating bath containing a water-soluble tin salt, one or more substances selected from inorganic acids, organic acids and their water-soluble salts, and one or more substances selected from water-soluble tungsten salts, water-soluble molybdenum salts and water-soluble manganese salts. This tin electroplating bath enables to form a tin-plated coating film on components for electronic devices such as a chip component, crystal oscillator, bump, connector, lead frame, hoop member, semiconductor package and printed board, as a substitute for a tin-lead alloy plating material, while having high whisker suppressing effects.

11 Claims, No Drawings

US 8,440,066 B2

TIN ELECTROPLATING BATH, TIN PLATING FILM, TIN ELECTROPLATING METHOD, AND ELECTRONIC DEVICE COMPONENT

TECHNICAL FIELD

This invention relates to a tin electroplating bath, tin plating film and tin electroplating process useful as substitutes for tin-lead alloy plating, and also to an electronic device component.

BACKGROUND ART

To components which require soldering, for example, components for electronic devices such as chip components, crystal oscillators, bumps, connectors, lead frames, hoops, semiconductor packages and printed boards, tin-lead alloy plating has been applied conventionally. In the fabrication or the like of printed boards, tin-lead alloy plating films have been widely used as etching resists.

In recent years, however, tighter regulations have been introduced on the use of lead as a measure for environmental protection, leading to an increasing desire for lead-free plating as a substitute for tin-lead alloy plating materials. With respect to lead-free tin alloy plating as one type of such lead-free plating, a variety of developments are being carried out. Examples of lead free plating include tin plating, tin-copper alloy plating, tin-silver alloy plating, tin-bismuth alloy plating, and the like. However, conventional tin plating films are known to be prone to the formation of whisker-shaped crystals called "whiskers", and these whiskers develop a problem such as short-circuiting. Further, lead-free tin alloy plating films developed to date are also still insufficient although compared with tin plating films, inhibitory effects are observed for the formation of whiskers.

Even if lead-free tin alloy plating is effective for the formation of whiskers, it tends to require irksome control of its plating bath because it is a type of alloy plating and needs to control two or more metal elements. Especially in a tin-silver alloy plating bath or tin-bismuth alloy plating bath, a substantial difference exists in potential between the two metal elements so that, if a tin anode surface or a plated workpiece is left immersed in the plating bath while no current is applied, silver or bismuth is allowed to replace and deposit on its surface and the tin anode or workpiece may become useless.

For the inhibition of the formation of whiskers, the following methods have been conventionally used (see Mitsubishi Electric Corporation Technical Report, vol. 53, No. 11, 1979 (Non-patent Document 1)), but they are accompanied by problems, respectively.

(1) Nickel plating is performed on an undercoat of tin or tin alloy plating: A nickel plating film acts as a barrier against the formation of an intermetallic compound between copper as a substrate and tin as a plating film to inhibit the formation of whiskers. There are, however, numerous components which do not permit nickel plating due to characteristics required for them.

(2) Tin or tin alloy plating is applied at a greater film thickness (10 to 20 μm or greater): An increase in film thickness inhibits the formation of whiskers because effects of an internal stress produced by the formation of an intermetallic compound do not reach the surface. There are, however, many electronic devices which do not permit an increase in plating film thickness.

(3) Application of heat treatment and reflow treatment after tin or tin alloy plating: Application of heat treatment and reflow treatment after tin or tin alloy plating makes it possible to form a layer of a stable intermetallic compound ($Cu_3Sn$ or the like) beforehand, and moreover, to relax an internal stress of a plating film and to inhibit the formation of whiskers. As a result of the heat treatment and reflow treatment, however, an oxide film is formed on the tin plating film to result in deteriorated solderability.

Patent Document 1:
Japanese Patent Laid-open No. 2003-293185
Patent Document 2:
Japanese Patent Laid-open No. 2005-2368
Non-patent Document 1:
Mitsubishi Electric Corporation Technical Report, Vol. 53, No. 11, 1979

DISCLOSURE OF THE INVENTION

Problems To Be Solved By The Invention

The present invention has been completed in view of the above-described circumstances, and its objects are to provide, as substitutes for tin-lead alloy plating, a tin electroplating bath, which can provide soldering-requiring components with good solderability or effectively serve as an etching resist, can effectively inhibit the formation of whiskers, can form tin plating films with high productivity, can be easily controlled and can assure good workability, a tin plating film formed using the tin electroplating bath, a tin electroplating process making use of the tin electroplating bath, and an electronic device component.

Means For Solving The Problems

The present inventors have conducted an enthusiastic investigation to achieve the above-described objects. As a result, it was found that an addition of a water-soluble tungsten salt, water-soluble molybdenum salt or water-soluble manganese salt to a tin electroplating bath makes it possible to inhibit the formation of whiskers on a tin plating film, to inhibit the formation of whiskers without arranging a film of nickel, silver or the like as a barrier layer for an intermetallic compound between a substrate copper alloy and tin as a plating film, and also to prevent a deterioration in solderability owing to the possibility of inhibition of the formation of whiskers without application of heat treatment and reflow treatment, and therefore, can effectively inhibit the formation of whiskers on a tin plating film in a simple manner, leading the completion of the present invention.

Described specifically, the present invention provides the following tin electroplating bath, tin plating film, tin electroplating process, and electronic device component.

[1] A tin electroplating bath including a water-soluble tin salt, one or more compounds selected from inorganic acids, organic acids and water-soluble salts of the inorganic acids and organic acids, and one or more salts selected from water-soluble tungsten salts, water-soluble molybdenum salts and water-soluble manganese salts.

[2] The tin electroplating bath as described above in [1], wherein the tin electroplating bath has a pH of lower than 1.

[3] The tin electroplating bath as described above in [1] or [2], wherein the water-soluble tin salt is a tin(II) alkanesulfonate or tin (II) alkanolsulfonate.

[4] The tin electroplating bath as described above in any one of [1] to [3], wherein the organic acids are alkanesulfonic acids or alkanolsulfonic acids.

[5] The tin electroplating bath as described above in any of [1] to [4], further including a nonionic surfactant.

[6] The tin electroplating bath as described above in [5], wherein the nonionic surfactant is a polyoxyethylene alkylphenyl ether surfactant.

[7] The tin electroplating bath as described above in any one of [1] to [6], further including a thioamide compound or non-aromatic thiol compound.

[8] The tin electroplating bath as described above in [7], wherein the thioamide compound is thiourea, dimethylthiourea, diethylthiourea, trimethylthiourea, N,N'-diisopropylthiourea, acetylthiourea, allylthiourea, ethylenethiourea, thiourea dioxide, thiosemicarbazide or tetramethylthiourea, and the non-aromatic thiol compound is mercarptoacetic acid, mercaptosuccinic acid, mercaptolactic acid or a water-soluble salt thereof.

[9] A tin plating film formed using a tin electroplating bath as described above in any of [1] to [8] and having an included carbon content of not higher than 0.1 wt % C.

[10] A tin electroplating process including a step of plating a workpiece by using a tin electroplating bath as described above in any of [1] to [8].

[11] An electronic device component with a tin plating film formed on the electronic device component by using a tin electroplating bath as described above in any of [1] to [8].

In the tin electroplating bath according to the present invention prepared by adding a water-soluble tungsten salt, water-soluble molybdenum salt or water-soluble manganese salt to a tin electroplating bath, tungsten ions, molybdenum ions or manganese ions are considered to act primarily as an inhibitor like a surfactant or the like upon formation of a tin plating film. A film to be plated in the tin electroplating bath, which contains tungsten ions, molybdenum ions or manganese ions, can effectively inhibit the formation of whiskers compared with a plating film to be obtained from a tin electroplating bath free of such ions. It is, however, to be noted that the added tungsten ions, molybdenum ions or manganese ions may codeposit in a trace amount electrochemically or physically depending on the plating conditions or the like.

As a substitute for the conventional tin plating or tin-lead alloy plating for soldering or as etching resists, the tin electroplating bath according to the present invention can be applied to all electronic device components which require lead-free solder plating, such as chip components, crystal oscillators, bumps, connectors, lead frames, hoops, semiconductor packages and printed boards.

Further, the tin electroplating bath is broad in the range of applicable cathode current densities, and over a broad range of from 0.01 to 100 A/dm$^2$, can obtain good tin plating films by various plating processes such as the barrel process, rack process, rackless process, reel-to-reel process, and roll-to-roll process (high-speed plating such as jet plating or flow plating). Furthermore, the tin electroplating bath makes it possible to apply tin plating to electronic device components with an insulating materials, such as ceramics, lead glass, plastics or ferrite combined therein, without causing corrosion, deformation, modification or the like of the insulating material.

Moreover, the tin plating bath can be used at high temperatures and can be raised in the concentration of divalent tin ions, and therefore, high-speed plating is feasible. Accordingly, the tin plating bath makes it possible to form tin plating films with high productivity, is free of the potential problem of replacement deposition unlike conventional tin-silver alloy plating baths and tin-bismuth alloy plating baths, and hence, enjoys easy control and high workability.

Effects Of The Invention

According to the present invention, tin plating films having high whisker inhibiting effects can be formed as a substitute for tin-lead alloy plating materials on electronic device components or the like such as chip components, crystal oscillators, bumps, connectors, lead frames, hoops, semiconductor packages and printed boards.

BEST MODES FOR CARRYING OUT THE INVENTION

The present invention will hereinafter be described in further detail.

The tin electroplating bath according to the present invention includes a water-soluble tin salt, one or more compounds selected from inorganic acids, organic acids and water-soluble salts thereof, and one or more salts selected from water-soluble tungsten salts, water-soluble molybdenum salts and water-soluble manganese salts.

The tin salt can be either a stannous salt or a stannic salt. Examples of the stannous salt (tin(II) salt) include tin(II) organosulfonates, for example, tin(II) alkanesulfonates such as tin(II) methanesulfonate, and tin(II) alkanolsulfonates such as tin(II) isethionate; and tin(II) sulfate, tin(II) borofluoride, tin(II) chloride, tin(II) bromide, tin(II) iodide, tin(II) oxide, tin(II) phosphate, tin(II) pyrophosphate, tin(II) acetate, tin(II) citrate, tin(II) gluconate, tin(II) tartrate, tin(II) lactate, tin(II) succinate, tin(II) sulfamate, tin(II) borofluoride, tin(II) formate, tin(II) silicofluoride, and the like. Examples of the stannic salt (tin(IV) salt) include sodium stannate and potassium stannate. In particular, tin(II) organosulfonates, for example, tin(II) alkanesulfonates such as tin(II) methanesulfonate and tin(II) alkanolsulfonates such as tin(II) isethionates are preferred.

In this case, the content of the water-soluble tin salt in the plating bath may be preferably from 5 to 100 g/L, notably from 10 to 70 g/L in terms of tin.

Especially when the water-soluble tin salt is a tin(II) alkanesulfonate or tin(II) alkanolsulfonate, the whisker inhibiting effects for the resulting tin plating film, which are available from the addition of a water-soluble tungsten salt, water-soluble molybdenum salt or water-soluble manganese salt to the tin electroplating bath, can be increased further.

Also, it makes possible to raise the concentration of divalent tin ions in the plating bath, and therefore, is suited for high-speed plating processes such as the rackless process, reel-to-reel process, roll-to-roll process and the like.

Further, the oxidation of divalent tin ions into tetravalent tin ions is slower than in the case of tin(II) sulfate, and therefore, it has such merits that the plating bath is provided with good stability and long life.

Next, examples of the inorganic acids, organic acids and water-soluble salts thereof include acids selected from sulfuric acid, hydrochloric acid, nitric acid, phosphoric acid, hydrofluoric acid, hydrofluoroboric acid, sulfamic acid, organic sulfonic acids (aliphatic sulfonic acids and aromatic sulfonic acids), carboxylic acids (saturated aliphatic carboxylic acids, aromatic carboxylic acids, aminocarboxylic acids, etc.), condensed phosphoric acids and phosphonic acids, and salts thereof; and lactone compounds.

Examples of the aliphatic sulfonic acids and aromatic sulfonic acids include substituted or unsubstituted alkanesulfonic acids, hydroxyalkanesulfonic acids, benzenesulfonic acids, naphthalenesulfonic acids, etc. As the unsubstituted alkanesulfonic acids, those represented by $C_nH_{2n+1}SO_3H$ (n: an integer of from 1 to 5, preferably 1 or 2) can be used.

As the unsubstituted hydroxyalkanesulfonic acids, those represented by the following formula can be used.

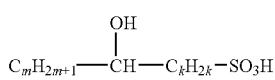
[Chemical Formula 1]

wherein m stands for 0, 1 or 2, and k stands for 1, 2 or 3).

Usable as the substituted alkanesulfonic acids and hydroxyalkanesulfonic acids are those each containing one or more of halogen atoms, aryl groups, alkylaryl groups, carboxyl group, sulfonic groups and the like as substituent(s) for a part of the hydrogen atoms on its alkyl group.

Benzenesulfonic acid and naphthalenesulfonic acid are represented by the following formulas, respectively.

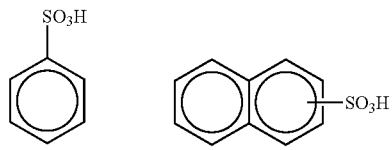
[Chemical Formula 2]

Usable as the substituted benzenesulfonic acids and naphthalenesulfonic acids are those each containing one or more of hydroxyl groups, halogen atoms, alkyl groups, carboxyl groups, nitro groups, mercapto groups, amino groups, sulfonic groups and the like as substituent(s) for a part of the hydrogen atoms on the benzene ring or naphthalene ring.

Specific examples include methanesulfonic acid, ethanesulfonic acid, isethionic acid, 1-propanesulfonic acid, 2-propanesulfonic acid, 1-butanesulfonic acid, 2-butanesulfonic acid, pentanesulfonic acid, chloropropanesulfonic acid, 2-hydroxyethane-1-sulfonic acid, 2-hydroxypropanesulfonic acid, 3-hydroxypropanesulfonic acid, 1-hydroxy-2-propanesulfonic acid, 2-hydroxybutane-1-sulfonic acid, 2-hydroxypentanesulfonic acid, allylsulfonic acid, 2-sulfoacetic acid, 2-sulfopropionic acid, 3-sulfopropionic acid, sulfosuccinic acid, sulfomaleic acid, sulfofumaric acid, benzenesulfonic acid, toluenesulfonic acid, xylenesulfonic acid, nitrobenzenesulfonic acid, sulfobenzoic acid, sulfosalicylic acid, benzaldehydesulfonic acid, p-phenolsulfonic acid, and the like.

Further, the carboxylic acids may preferably be those containing no aliphatic double bond. Specific examples of the saturated aliphatic carboxylic acids include monocarboxylic acids such as formic acid, acetic acid, lactic acid, propionic acid, butyric acid and gluconic acid; dicarboxylic acids such as oxalic acid, malonic acid, succinic acid, tartaric acid and malic acid; and tricarboxylic acids such as citric acid and tricarballytic acid. Specific examples of the aromatic carboxylic acids include phenylacetic acid, benzoic acid, anisic acid, and the like. Specific examples of the aminocarboxylic acids include iminodiacetic acid, nitrilotriacetic acid (NTA), ethylenediaminetetraacetic acid (EDTA), diethylenetriaminepentaacetic acid, and the like.

Specific examples of the condensed phosphoric acids include pyrophosphoric acid, tripolyphosphoric acid, tetrapolyphosphoric acid, polyphosphoric acids (polymerization degree: 5 and higher), hexametaphosphoric acid, and the like. Specific examples of the phosphonic acids include aminotrimethylenephosphonic acid, 1-hydroxyethylidene-1,1-diphosphonic acid, ethylenediaminetetramethylenephosphonic acid, diethylenetriaminepentamethylenephosphonic acid, and the like.

Examples of the salts include alkali metal salts (sodium, potassium, lithium and like salts), alkaline earth metal salts (magnesium, calcium, barium and like salts), divalent tin salts, tetravalent tin salts, ammonium salts, organic amine salts (monomethylamine, dimethylamine, trimethylamine, ethylamine, isopropylamine, ethylenediamine, diethylenetriamine and the like), and like salts of the above-exemplified acids. Further, examples of the lactone compounds include gluconolactone, gluconoheptolactone and the like.

The content of such an inorganic acid or organic acid or its water-soluble salt in the plating bath may be preferably 50 g/L or higher, notably 100 g/L or higher, but preferably not higher than 600 g/L, more preferably not higher than 400 g/L. An excessively low content provides the plating bath with reduced stability so that settlings tend to occur, while an unduly high content tends to become an excess content that cannot bring about any extra effects.

Especially when the inorganic acid or organic acid or its water-soluble salt is an alkanesulfonic acid or alkanolsulfonic acid, it is possible to further enhance the whisker inhibiting effects for the resulting tin plating film, which whisker inhibiting effects are available by the addition of a water-soluble tungsten salt, water-soluble molybdenum salt or water-soluble manganese salt to the tin electroplating bath.

Also, it makes possible to raise the concentration of divalent tin ions in the plating bath, and therefore, is suited for high-speed plating processes such as the rackless process, reel-to-reel process, roll-to-roll process and the like.

Further, the oxidation of divalent tin ions into tetravalent tin ions is slower than an acid such as sulfuric acid or hydroborofluoric acid commonly employed in tin electroplating baths, and therefore, it has such merits that the plating bath is provided with good stability and long life.

The plating bath according to the present invention also contains, as a crystallization control agent, one or more salts selected from water-soluble tungsten salts, water-soluble molybdenum salts and water-soluble manganese salts. Examples of the water-soluble tungsten include tungstic acid, sodium tungstate(VI) dehydrate, potassium tungstate, ammonium paratungstate, and the like. Examples of the water-soluble molybdenum salts include molybdic acid, sodium molybdate dehydrate, potassium molybdate, ammonium molybdate tetrahydrate, and the like. Examples of the water-soluble manganese salts include manganese(II) nitrate hexahydrate, manganese(II) acetate tetrahydrate, manganese (II) chloride tetrahydrate, ammonium manganese(II) sulfate hexahydrate, and the like.

The content of such a water-soluble tungsten salt, water-soluble molybdenum salt or water-soluble manganese salt in the plating bath may be preferably from 0.01 to 10 g/L, more preferably from 0.1 to 2 g/L in terms of tungsten, molybdenum or manganese. An excessively low content leads to a reduction in the whisker inhibiting effects for the resulting tin plating film, while an unduly high content may provide the resulting tin plating film with a deteriorated appearance and impaired physical properties.

To smoothen and densify the resulting plating film at its surface and also to adequately disperse other hydrophobic organic compounds such as a smoothing agent and brightener, one or more of nonionic surfactants, cationic surfactants. anionic surfactants and amphoteric surfactants can be added as needed. The workability of plating processing can be improved especially by adding a nonionic surfactant which is low in formability.

As a nonionic surfactant, an alkylene oxide nonionic surfactant is suited. Usable examples include polyoxyethylene alkyl ethers, polyoxyethylene alkylphenyl ethers, polyoxyethylene alkylamines, polyoxyethylene alkylamides, polyoxyethylene fatty acid esters, polyoxyethylene polyhydric alcohol ethers, ethylene oxide-propylene oxide block copolymer surfactants, ethylene oxide-propylene oxide random copolymer surfactants and propylene oxide polymer surfactants, with the use of polyoxyethylene alkylphenyl ethers being particularly preferred. The content of a surfactant in the plating bath may be preferably from 0.01 to 100 g/L, notably from 5 to 50 g/L. An excessively low content may cause yellowing or burning at high current densities, while an unduly high content may result in such a defect that the resulting plating film becomes darker or irregular in color.

Especially when the nonionic surfactant is a polyoxyethylene alkylphenyl ether, it is possible to further enhance the whisker inhibiting effects for the resulting tin plating film, which whisker inhibiting effects are available by the addition of a water-soluble tungsten salt, water-soluble molybdenum salt or water-soluble manganese salt to the tin electroplating bath.

Usable examples of the smoothing agent include thiazole compounds, mercapto-containing aromatic compounds and aromatic dioxy compounds, and usable examples of the brightener include aldehyde compounds and unsaturated carboxylic acid compounds. Many of these compounds are hydrophobic, so that they are added to the plating bath after being dissolved in an organic solvent beforehand. The solubility of these hydrophobic compounds can be significantly increased especially when among these nonionic surfactants, a polyoxyethylene alkylphenyl ether is used in combination with an organic solvent to dissolve them.

By further adding a thioamide compound or non-aromatic thiol compound to the plating bath according to the present invention, the whisker inhibiting effects can be enhanced still further.

Usable examples of the thioamide compound and non-aromatic thiol compound include $C_{1-15}$ thioamide compounds such as thiourea, dimethylthiourea, diethylthiourea, trimethylthiourea, N,N'-diisopropylthiourea, acetylthiourea, allylthiourea, ethylenethiourea, thiourea dioxide, thiosemicarbazide and tetramethylthiourea; and $C_{2-6}$ non-aromatic thiol compounds, for example, acids such as mercarptoacetic acid (thioglycolic acid), mercaptosuccinic acid (thiomalic acid) and mercaptolactic acid and their water-soluble salts (for example, their alkali metal salts, ammonium salts, magnesium salts, etc.). Particularly preferred are thiourea, dimethylthiourea, diethylthiourea, trimethylthiourea, N,N'-diisopropylthiourea, acetylthiourea, allylthiourea, ethylenethiourea, thiourea dioxide, thiosemicarbazide, tetramethylthiourea; mercarptoacetic acid, mercaptosuccinic acid and mercaptolactic acid and their water-soluble salts.

The content of the thioamide compound or non-aromatic thiol compound in the plating bath may be set preferably at from 1 to 50 g/L, notably at from 2 to 20 g/L. An unduly low content may not bring about its effects fully, while an excessively high content may interfere with microcrystallization of the plating film to be deposited.

One or more organic solvents can also be added to the plating bath according to the present invention as needed. Examples of the organic solvents include monohydric alcohols such as 2-propanol; and dihydric alcohols (glycols) such as ethylene glycol, diethylene glycol and triethylene glycol. The content of such an organic solvent in the plating bath may be preferably from 1 to 200 g/L, notably from 5 to 100 g/L.

To the plating bath according to the present invention, one or more compounds selected from thiazole compounds, mercapto-containing aromatic compounds and aromatic dioxy compounds can also be added as a smoothing agent for the surface of the resulting plating film. Illustrative of the thiazole compounds, mercapto-containing aromatic compounds and aromatic dioxy compounds are thiazole, benzothiazole, 6-aminobenzothiazole, 2-mercaptobenzothiazole, 2-mercaptobenzoimidazole, 2-mercaptobenzooxazole, 2-mercaptobenzoic acid, mercaptophenol, mercaptopyridine, hydroquinone, cathecol, and the like.

The content of such a thiazole compound, mercapto-containing aromatic compound or aromatic dioxy compound in the plating bath may be set preferably at from 0.001 to 20 g/L, notably at from 0.001 to 5 g/L. An unduly low content may not bring about its effects fully, while an excessively high content exceeds its solubility in the plating bath so that the plating bath may become unstable and may form turbidity and/or settlings.

To the plating bath according to the present invention, one or more compounds selected from aldehyde compounds and unsaturated carboxylic acid compounds can also be added as brightener to be provided on the plating film surface. Examples of the aldehyde compounds and unsaturated carboxylic acid compounds include 1-naphthoaldehyde, 2-naphthoaldehyde, o-chlorobenzaldehyde, m-chlorobenzaldehyde, p-chlorobenzaldehyde, 2,4-dichlorobenzaldehyde, formaldehyde, acetaldehyde, salicylaldehyde, 2-thiophenaldehyde, 3-thiophenaldehyde, o-anisaldehyde, m-anisaldehyde, p-anisaldehyde, salicylaldehyde allyl ether, acrylic acid, methacrylic acid, ethacrylic acid, benzoic acid, fumaric acid, phthalic acid, citraconic acid, itaconic acid, crotonic acid, and the like.

An addition of such a component to the plating bath can provide the appearance of the resulting plating film with a semi-brightness to brightness and can also provide the plating film with a dense surface, and therefore, can assure the plating film to show improved solderability in a high-temperature and high-humidity test such as the pressure cooker test. The content of the unsaturated carboxylic acid or aldehyde compound in the plating bath can be set at from 0.001 to 50 g/L, notably from 0.01 to 10 g/L.

It is to be noted that, when an organic component, especially a brightener component is included in a plating film and the content of included carbon compound increases, the crystalline lattices in the tin plating film are distorted to produce a higher internal stress in the plating film. As a result, the formation of whiskers is facilitated under the influence of the higher internal stress. Effects of a brightener on a tin plating film can be varied by various plating condition such as cathode current densities; however, it can be obtained by measuring as an index the content of carbon in the plating film as included by the addition of the brightener component. The included carbon content in the plating film can be readily measured by causing the plating film to burn under radiofrequency radiation and performing a quantitative infrared analysis of the resulting carbon dioxide ($CO_2$). When the included carbon content in a plating film exceeds 0.1 wt % C, the carbon begins to give deleterious effects to the inhibition of whiskers. It is, therefore, preferred to choose the kind and content of each organic component such as a brightener such that the included carbon content in the resulting plating film can be controlled preferably to 0.1 wt % C or lower, notably to 0.01 wt % C or lower. It is to be noted that, when the tin electroplating bath according to the present invention does not use any brightener or the content of a brightener is set at 1.0 g/L or lower, notably at 0.1 g/L or lower, a tin plating film can be formed generally with an included carbon content of from 0.1 wt % C or lower, notably of from 0.01 wt % C or lower in the plating film.

The tin electroplating bath according to the present invention may preferably be acidic, with a pH of not higher than 1 being particularly preferred.

As a process for performing electroplating with the plating bath according to the present invention, a conventional process can be adopted. Either the rack process or the barrel process can be adopted, or a high-speed plating process such as the rackless process, reel-to-reel process or roll-to-roll process can also be adopted. Depending on the plating process, the cathode current density can be set as desired within a range of from 0.01 to 100 A/dm$^2$, notably from 0.1 to 30 A/dm$^2$. The cathode current density may be generally from 0.01 to 1 A/dm$^2$, notably from 0.05 to 0.5 A/dm$^2$ in the case of the barrel plating process; generally from 0.5 to 5 A/dm$^2$, notably from 1 to 4 A/dm$^2$ in the case of the rack plating process; and generally from 5 to 100 A/dm$^2$, notably from 5 to 30 A/dm$^2$ in the case of high-speed plating processes. The plating temperature may be set at from 10 to 60° C., notably at from 20 to 50° C. As for agitation, cathode rocking, agitation by a stirrer, traveling of substrates by an automated transportation system, or flowing of the solution by a pump, for example, can be adapted, although no agitation can also be adapted. As an anode, it is preferred to use a soluble anode, specifically tin in general, although an insoluble anode such as carbon or platinum may also be used. It is to be noted that the cathode current efficiency of the plating bath according to the present invention is generally from 80 to 99%.

On the other hand, no particular limitation is imposed on the kind of workpieces, insofar as they have a conductive part which can be electroplated. They may be made of a conductive material, for example, a metal such as copper or may be made of a material composed in combination of such a conductive material and an insulating material such as ceramics, lead glass, plastics or ferrite. These workpieces are subjected to plating after suitable pretreatment commensurate with their material is applied beforehand.

Specifically, tin plating films having high whisker inhibiting effects can be formed on solder-requiring parts of all electronic device components—such as chip components, crystal oscillators, bumps, connectors, lead frames, hoops, semiconductor packages and printed boards—and other products as workpieces.

EXAMPLES

The present invention will hereinafter be described specifically based on Examples and Comparative Examples, although the present invention shall not be limited to the following Examples.

Examples 1 to 24 & Comparative Examples 1 to 12

Tin plating baths of the compositions shown in Tables 1 to 3 were prepared. In the respective plating baths, phosphor bronze (C5191) lead frames to which pretreatment had been applied in the usual manner were immersed. Using the lead frames as cathodes and tin plates as anodes, respectively, tin electroplating was applied at a bath temperature of 45° C. and the cathode current densities shown in Tables 1 to 3, respectively, to form tin plating films of 2 to 3 μm thickness.

Next, after the lead frames with the tin plating films formed thereon were left over for 1 week under constant temperature and constant humidity of 30° C. and 60% RH, surfaces of the tin plating films on the lead frames were microscopically observed by a scanning electron microscope to count the numbers of whiskers of 10 μm and longer per unit area (0.51 mm×0.42 mm≈0.21 mm$^2$). Further, greatest whisker lengths were also measured. The reason why only whiskers of 10 μm and longer were counted is that it was conducted based on the definition for whiskers as set out in the whisker testing method for electric/electronic device components in the Japan Electronics and Information Technology Industries Association Standards (JEITA ET-7410).

TABLE 1

| | Plating bath component | Example | | | | | |
|---|---|---|---|---|---|---|---|
| | | 1 | 2 | 3 | 4 | 5 | 6 |
| Water-soluble tin salt (in terms of Sn$^{2+}$ ions) [g/L] | Tin(II) sulfate | 40 | 40 | 40 | | | |
| | Tin(II) borofluoride | | | | 20 | 20 | 20 |
| | Tin(II) methanesulfonate | | | | | | |
| | Tin(II) isethionate | | | | | | |
| Inorganic acid or organic acid [g/L] | Sulfuric acid | 100 | 100 | 100 | | | |
| | Hydrogenborofluoric acid | | | | 200 | 200 | 200 |
| | Methanesulfonic acid | | | | | | |
| | Isethionic acid | | | | | | |
| Water-soluble W, Mo or Mn compound (as W, Mo or Mn) [g/L] | Sodium tungstate (VI) dihydrate | | | | 0.5 | 0.5 | 0.6 |
| | Sodium molybdate (VI) dehydrate | | 0.5 | | 0.5 | | 0.6 |
| | Manganese(II) acetate tetrahydrate | 0.2 | | | | 0.5 | | 2 |
| Nonionic surfactant [g/L] | Polyoxyethylene β-naphthyl ether (number of moles of added EO: 10) | 10 | | | 20 | | |
| | Polyoxyethylene paracumyl ether (number of moles of added EO: 10) | | | 10 | | | 20 |

TABLE 1-continued

|  |  |  |  |  |  |  |  |
|---|---|---|---|---|---|---|---|
|  | Polyoxyethylene stearylamine (number of moles of added EO: 10) |  |  | 10 |  | 20 |  |
|  | Polyoxyethylene polyoxypropylene glycol (average molecular weight: 2500, EO/PO = 60/40) |  |  |  |  |  |  |
| Thioamide compound or non-aromatic thiol compound [g/L] | Thiourea |  |  |  |  |  |  |
|  | Ethylene thiourea |  |  |  |  |  |  |
|  | Mercaptoacetic acid |  | 10 |  |  | 5 |  |
|  | Mercaptosuccinic acid |  |  | 10 |  |  | 5 |
| Smoothing agent [g/L] | Benzothiazole |  |  | 1 |  |  |  |
|  | 2-Mercapto benzothiazole | 1 |  |  |  | 3 |  |
|  | 2-Mercapto benzoxazole |  |  |  | 3 |  |  |
|  | 2-Mercapto benzimidazole |  |  |  | 1 |  | 3 |
| Brightener [g/L] | o-Chlorobenzaldehyde |  |  |  |  |  |  |
|  | Methacrylic acid |  |  |  |  |  |  |
| Organic solvent [g/L] | Isopropyl alcohol | 20 |  |  | 50 |  |  |
|  | Ethylene glycol |  | 20 |  |  |  | 50 |
|  | Diethylene glycol |  |  |  |  | 50 |  |
|  | Triethylene glycol |  |  | 20 |  |  |  |
| pH |  | <1 | <1 | <1 | <1 | <1 | <1 |
| Cathode current density [A/dm$^2$] |  | 1 | 5 | 10 | 2 | 5 | 20 |
| Number of formed whiskers |  | 10 | 7 | 8 | 8 | 7 | 8 |
| Greatest whisker length [μm] |  | 21 | 16 | 20 | 23 | 18 | 21 |
| Content of carbon included in Sn plating film [wt % C] |  | 0.001 | 0.002 | 0.002 | 0.004 | 0.004 | 0.005 |

|  |  | Example |  |  |  |  |  |
|---|---|---|---|---|---|---|---|
| Plating bath component |  | 7 | 8 | 9 | 10 | 11 | 12 |
| Water-soluble tin salt (in terms of Sn$^{2+}$ ions) [g/L] | Tin(II) sulfate |  |  |  |  |  |  |
|  | Tin(II) borofluoride |  |  |  |  |  |  |
|  | Tin(II) methanesulfonate | 50 | 50 | 50 |  |  |  |
|  | Tin(II) isethionate |  |  |  | 70 | 70 | 70 |
| Inorganic acid or organic acid [g/L] | Sulfuric acid |  |  |  |  |  |  |
|  | Hydrogenborofluoric acid |  |  |  |  |  |  |
|  | Methanesulfonic acid | 300 | 300 | 300 | 100 | 100 | 100 |
|  | Isethionic acid |  |  |  | 300 | 300 | 300 |
| Water-soluble W, Mo or Mn compound (as W, Mo or Mn) [g/L] | Sodium tungstate (VI) dihydrate |  |  | 3 | 1 |  | 2 |
|  | Sodium molybdate (VI) dehydrate | 0.5 | 1.5 |  |  |  | 2 |
|  | Manganese(II) acetate tetrahydrate | 0.5 |  |  |  | 2 | 2 |
| Nonionic surfactant [g/L] | Polyoxyethylene β-naphthyl ether (number of moles of added EO: 10) |  |  |  |  |  | 50 |
|  | Polyoxyethylene paracumyl ether (number of moles of added EO: 10) |  | 50 |  |  |  |  |
|  | Polyoxyethylene stearylamine (number of moles of added EO: 10) | 50 |  |  | 50 |  |  |
|  | Polyoxyethylene polyoxypropylene glycol (average molecular weight: 2500, EO/PO = 60/40) |  |  | 50 |  | 50 |  |

TABLE 1-continued

| | | | | | | | |
|---|---|---|---|---|---|---|---|
| Thioamide compound or non-aromatic thiol compound [g/L] | Thiourea | 10 | | | 20 | | |
| | Ethylene thiourea | | 10 | | | 20 | |
| | Mercaptoacetic acid | | | | | | |
| | Mercaptosuccinic acid | | | | | | |
| Smoothing agent [g/L] | Benzothiazole | | | | 4 | | 0.1 |
| | 2-Mercapto benzothiazole | 4 | | | | | |
| | 2-Mercapto benzoxazole | | | 4 | | 0.1 | |
| | 2-Mercapto benzimidazole | | | | | | 0.1 |
| Brightener [g/L] | o-Chlorobenzaldehyde | | | | | | |
| | Methacrylic acid | | | | | | |
| Organic solvent [g/L] | Isopropyl alcohol | 50 | | | | | |
| | Ethylene glycol | | | | | 10 | |
| | Diethylene glycol | | 50 | | 10 | | |
| | Triethylene glycol | | | 50 | | | 10 |
| pH | | <1 | <1 | <1 | <1 | <1 | <1 |
| Cathode current density [A/dm$^2$] | | 2 | 5 | 20 | 1 | 5 | 10 |
| Number of formed whiskers | | 4 | 3 | 7 | 5 | 6 | 3 |
| Greatest whisker length [μm] | | 15 | 12 | 17 | 12 | 19 | 11 |
| Content of carbon included in Sn plating film [wt % C] | | 0.005 | 0.004 | 0.004 | 0.001 | 0.002 | 0.001 |

TABLE 2

| | | Example | | | | | | | | | | | |
|---|---|---|---|---|---|---|---|---|---|---|---|---|---|
| Plating bath component | | 13 | 14 | 15 | 16 | 17 | 18 | 19 | 20 | 21 | 22 | 23 | 24 |
| Water-soluble tin salt (in terms of Sn$^{2+}$ ions) [g/L] | Tin(II) sulfate | 40 | 40 | 40 | 40 | 40 | 40 | | | | | | |
| | Tin(II) borofluoride | | | | | | | | | | | | |
| | Tin(II) methanesulfonate | | | | | | | 50 | 50 | 50 | 50 | 50 | 50 |
| | Tin(II) isethionate | | | | | | | | | | | | |
| Inorganic acid or organic acid [g/L] | Sulfuric acid | 100 | 100 | 100 | 100 | 100 | 100 | | | | | | |
| | Hydrogenborofluoric acid | | | | | | | | | | | | |
| | Methanesulfonic acid | | | | | | | 300 | 300 | 300 | 300 | 300 | 300 |
| | Isethionic acid | | | | | | | | | | | | |
| Water-soluble W, Mo or Mn compound (as W, Mo or Mn) [g/L] | Sodium tungstate (VI) dihydrate | 0.5 | 0.5 | 0.5 | 0.5 | 0.5 | 0.5 | | | | | | |
| | Sodium molybdate (VI) dehydrate | | | | | | | 1 | 1 | 1 | 1 | 1 | 1 |
| | Manganese(II) acetate tetrahydrate | | | | | | | 0.5 | 0.5 | 0.5 | 0.5 | 0.5 | 0.5 |
| Nonionic surfactant [g/L] | Polyoxyethylene β-naphthyl ether (number of moles Of added EO: 10) | 20 | 20 | 20 | 20 | 20 | 20 | | | | | | |
| | Polyoxyethylene paracumyl ether (number of moles of added EO: 10) | | | | | | | | | | | | |
| | Polyoxyethylene stearylamine (number of moles of added EO: 10) | | | | | | | | | | | | |
| | Polyoxyethylene polyoxypropylene glycol (average molecular weight: 2500, EO/PO = 60/40) | | | | | | | 50 | 50 | 50 | 50 | 50 | 50 |

TABLE 2-continued

| Plating bath component | | Example | | | | | | | | | | | |
|---|---|---|---|---|---|---|---|---|---|---|---|---|
| | | 13 | 14 | 15 | 16 | 17 | 18 | 19 | 20 | 21 | 22 | 23 | 24 |
| Thioamide compound or non-aromatic thiol compound [g/L] | Thiourea | | | | | | | | | | | | |
| | Ethylene thiourea | | | | | | | 20 | 20 | 20 | | | |
| | Mercaptoacetic acid | 10 | 10 | 10 | | | | | | | | | |
| | Mercaptosuccinic acid | | | | | | | | | | | | |
| Smoothing agent [g/L] | Benzothiazole | | | | | | | 1 | 1 | 1 | 1 | 1 | 1 |
| | 2-Mercapto benzothiazole | | | | | | | | | | | | |
| | 2-Mercapto benzoxazole | 2 | 2 | 2 | 2 | 2 | 2 | | | | | | |
| | 2-Mercapto benzimidazole | | | | | | | | | | | | |
| Brightener [g/L] | o-Chlorobenzaldehyde | | 0.2 | 2 | | 0.2 | 2 | | 0.2 | 2 | | 0.2 | 2 |
| | Methacrylic acid | | 0.2 | 2 | | 0.2 | 2 | | | | | | |
| Organic solvent [g/L] | Isopropyl alcohol | | | | | | | 20 | 20 | 20 | 20 | 20 | 20 |
| | Ethylene glycol | 50 | 50 | 50 | 50 | 50 | 50 | | | | | | |
| | Diethylene glycol | | | | | | | | | | | | |
| | Triethylene glycol | | | | | | | | | | | | |
| pH | | <1 | <1 | <1 | <1 | <1 | <1 | <1 | <1 | <1 | <1 | <1 | <1 |
| Cathode current density [A/dm$^2$] | | 20 | 20 | 20 | 20 | 20 | 20 | 5 | 5 | 5 | 5 | 5 | 5 |
| Number of formed whiskers | | 6 | 11 | 20 | 12 | 19 | 26 | 5 | 10 | 21 | 7 | 18 | 24 |
| Greatest whisker length [μm] | | 15 | 25 | 38 | 23 | 25 | 42 | 12 | 19 | 33 | 15 | 21 | 41 |
| Content of carbon included in Sn plating film [wt % C] | | 0.004 | 0.04 | 0.4 | 0.004 | 0.04 | 0.4 | 0.002 | 0.02 | 0.2 | 0.002 | 0.02 | 0.2 |

TABLE 3

| Plating bath component | | Comparative Example | | | | | |
|---|---|---|---|---|---|---|---|
| | | 1 | 2 | 3 | 4 | 5 | 6 |
| Water-soluble tin salt (in terms of Sn$^{2+}$ ions) [g/L] | Tin(II) sulfate | 40 | 40 | 40 | | | |
| | Tin(II) borofluoride | | | | 20 | 20 | 20 |
| | Tin(II) methanesulfonate | | | | | | |
| | Tin(II) isethionate | | | | | | |
| Inorganic acid or organic acid [g/L] | Sulfuric acid | 100 | 100 | 100 | | | |
| | Hydrogenborofluoric acid | | | | 200 | 200 | 200 |
| | Methanesulfonic acid | | | | | | |
| | Isethionic acid | | | | | | |
| Water-soluble W, Mo or Mn compound (as W, Mo or Mn) [g/L] | Sodium tungstate (VI) dihydrate | | | | | | |
| | Sodium molybdate (VI) dehydrate | | | | | | |
| | Manganese(II) acetate tetrahydrate | | | | | | |
| Nonionic surfactant [g/L] | Polyoxyethylene β-naphthyl ether (number of moles of added EO: 10) | 10 | | | 20 | | |
| | Polyoxyethylene paracumyl ether (number of moles of added EO: 10) | | 10 | | | 20 | |
| | Polyoxyethylene stearylamine (number of moles of added EO: 10) | | | 10 | | | 20 |
| | Polyoxyethylene polyoxypropylene glycol (average molecular weight: 2500, EO/PO = 60/40) | | | | | | |

TABLE 3-continued

| Plating bath component | | | | | | | |
|---|---|---|---|---|---|---|---|
| Thioamide compound or non-aromatic thiol compound [g/L] | Thiourea | | | | | | |
| | Ethylene thiourea | | | | | | |
| | Mercaptoacetic acid | | 10 | | | 5 | |
| | Mercaptosuccinic acid | | | 10 | | | 5 |
| Smoothing agent [g/L] | Benzothiazole | | | 1 | | | |
| | 2-Mercapto benzothiazole | 1 | | | | 3 | |
| | 2-Mercapto benzoxazole | | | | 3 | | |
| | 2-Mercapto benzimidazole | | | 1 | | | 3 |
| Brightener [g/L] | o-Chlorobenzaldehyde | | | | | | |
| | Methacrylic acid | | | | | | |
| Organic solvent [g/L] | Isopropyl alcohol | 20 | | | 50 | | |
| | Ethylene glycol | | 20 | | | | 50 |
| | Diethylene glycol | | | | | 50 | |
| | Triethylene glycol | | | 20 | | | |
| pH | | <1 | <1 | <1 | <1 | <1 | <1 |
| Cathode current density [A/dm$^2$] | | 1 | 5 | 10 | 2 | 5 | 20 |
| Number of formed whiskers | | 34 | 23 | 29 | 33 | 27 | 35 |
| Greatest whisker length [μm] | | 80 | 55 | 75 | 71 | 54 | 76 |
| Content of carbon included in Sn plating film [wt % C] | | 0.001 | 0.002 | 0.001 | 0.005 | 0.005 | 0.006 |

| | | Comparative Example | | | | | |
|---|---|---|---|---|---|---|---|
| Plating bath component | | 7 | 8 | 9 | 10 | 11 | 12 |
| Water-soluble tin salt (in terms of Sn$^{2+}$ ions) [g/L] | Tin(II) sulfate | | | | | | |
| | Tin(II) borofluoride | | | | | | |
| | Tin(II) methanesulfonate | 50 | 50 | 50 | | | |
| | Tin(II) isethionate | | | | 70 | 70 | 70 |
| Inorganic acid or organic acid [g/L] | Sulfuric acid | | | | | | |
| | Hydrogenborofluoric acid | | | | | | |
| | Methanesulfonic acid | 300 | 300 | 300 | 100 | 100 | 100 |
| | Isethionic acid | | | | 300 | 300 | 300 |
| Water-soluble W, Mo or Mn compound (as W, Mo or Mn) [g/L] | Sodium tungstate (VI) dihydrate | | | | | | |
| | Sodium molybdate (VI) dehydrate | | | | | | |
| | Manganese(II) acetate tetrahydrate | | | | | | |
| Nonionic surfactant [g/L] | Polyoxyethylene β-naphthyl ether (number of moles of added EO: 10) | | | | | | 50 |
| | Polyoxyethylene paracumyl ether (number of moles of added EO: 10) | | 50 | | | | |
| | Polyoxyethylene stearylamine (number of moles of added EO: 10) | 50 | | | 50 | | |
| | Polyoxyethylene polyoxypropylene glycol (average molecular weight: 2500, EO/PO = 60/40) | | | 50 | | 50 | |
| Thioamide compound or non-aromatic thiol compound [g/L] | Thiourea | 10 | | | 20 | | |
| | Ethylene thiourea | | 10 | | | | 20 |
| | Mercaptoacetic acid | | | | | | |
| | Mercaptosuccinic acid | | | | | | |

TABLE 3-continued

| | | | | | | | |
|---|---|---|---|---|---|---|---|
| Smoothing agent [g/L] | Benzothiazole | | | 4 | | 0.1 | |
| | 2-Mercapto benzothiazole | 4 | | | | | |
| | 2-Mercapto benzoxazole | | 4 | | 0.1 | | |
| | 2-Mercapto benzimidazole | | | | | | 0.1 |
| Brightener [g/L] | o-Chlorobenzaldehyde | | | | | | |
| | Methacrylic acid | | | | | | |
| Organic solvent [g/L] | Isopropyl alcohol | 50 | | | | | |
| | Ethylene glycol | | | | | 10 | |
| | Diethylene glycol | | 50 | | 10 | | |
| | Triethylene glycol | | | 50 | | | 10 |
| pH | | <1 | <1 | <1 | <1 | <1 | <1 |
| Cathode current density [A/dm$^2$] | | 2 | 5 | 20 | 1 | 5 | 10 |
| Number of formed whiskers | | 21 | 17 | 30 | 19 | 33 | 20 |
| Greatest whisker length [μm] | | 50 | 53 | 57 | 51 | 52 | 50 |
| Content of carbon included in Sn plating film [wt % C] | | 0.004 | 0.005 | 0.004 | 0.001 | 0.002 | 0.002 |

From the above-described results, it is appreciated that the tin electroplating bath according to the present invention can form a tin plating film having high whisker inhibiting effects. It is also appreciated that compared with a tin electroplating bath containing neither a thioamide compound nor a non-aromatic thiol compound added therein and having an included carbon content of higher than 0.1 wt % C (Example 18 and Example 24), one containing a thioamide compound or non-aromatic thiol compound added therein (Examples 13 to 15 and Examples 19 to 21) and one containing neither a thioamide compound nor a non-aromatic thiol compound added therein but having an included carbon content of not higher than 0.1 wt % C (Examples 16 and 17, and Examples 22 and 23) both have high whisker inhibiting effects.

It is also appreciated that irrespective of the inclusion or non-inclusion of a thioamide compound or non-aromatic thiol compound, a higher included carbon content leads to increases in both the number of formed whiskers and greatest whisker length (compare Examples 13 to 15, Examples 16 to 18, Examples 19 to 21, or Examples 22 to 24).

It is also appreciated that highest whisker inhibiting effects are available especially from those containing a thioamide compound or non-aromatic thiol compound added therein and having an included carbon content of not higher than 0.1 wt % C (Example 13 and Example 19).

The invention claimed is:

1. A tin electroplating bath comprising a water-soluble tin salt, one or more compounds selected from inorganic acids, organic acids, and water-soluble salts of the inorganic acids and organic acids, and one or more salts selected from water-soluble molybdenum compounds, and having a pH of lower than 1, wherein
said one or more water-soluble molybdenum compounds are selected from the group consisting of molvbdic acid, sodium molybdate dehydrate, potassium molybdate, ammonium molybdate tetrahydrate and mixture thereof, and
the content of said one or more water-soluble molybdenum compounds is 0.01 to 10 g/L, in terms molybdenum.

2. The tin electroplating bath according to claim 1, wherein said. water-soluble tin salt is a tin(II) alkanesulfonate or tin (II) alkanolsulfonate.

3. The tin electroplating bath according to claim 1, wherein said organic acids are alkanesulfonic acids or alkanolsulfonic acids.

4. The tin electroplating bath according to claim 1, further comprising a nonionic surfactant, 5. The tin electroplating bath according to claim 4, wherein said nonionic surfactant is a polyoxyethylene alkyiphenyl ether surfactant.

6. The tin electroplating bath according to claim 1, further comprising a thioamide compound or non-aromatic thiol compound.

7. The tin electroplating bath according to claim 6, wherein said thioamide compound is thiourea, dimethylthiourea, diethylthiourea, trimethylthiourea, N, N'-diisopropylthiourea, acetylthiourea, allylthiourea, ethylenethiourea, thiourea dioxide, thiosemicarbazide or tetramethyithiourea, and said non-aromatic thiol compound is mercaptoacetic acid, mercaptosuceinic acid, mercaptolactic acid or a water-soluble salt thereof.

8. The tin electroplating bath according to claim 1, wherein the content of said one or more water-soluble molybdenum compounds is 0.1 to 2g/L in terms of molybdenum.

9. The tin electroplating bath according to claim 1, wherein the content of said water-soluble tin salt is 5 to 100 g/L in terms of tin.

10. The tin electroplating bath according to claim 1, wherein the content of said water-soluble tin salt is 10 to 70 g/L in terms of tin.

11. A tin electroplating process comprising a step of electroplating a workpiece by using the tin electroplating bath according, to claim 1.

* * * * *